US010329664B2

(12) United States Patent
Fisher et al.

(10) Patent No.: US 10,329,664 B2
(45) Date of Patent: Jun. 25, 2019

(54) COMPOSITIONS OF MATTER AND METHODS OF PRODUCING A CARBONIZED CLOTH FOR GROWTH OF GRAPHENE NANO-PETALS

(71) Applicant: Purdue Research Foundation, West Lafayette, IN (US)

(72) Inventors: Timothy Fisher, West Lafayette, IN (US); Guoping Xiong, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 566 days.

(21) Appl. No.: 15/007,966

(22) Filed: Jan. 27, 2016

(65) Prior Publication Data

US 2016/0215389 A1 Jul. 28, 2016

Related U.S. Application Data

(60) Provisional application No. 62/108,454, filed on Jan. 27, 2015.

(51) Int. Cl.
  *C23C 16/00* (2006.01)
  *C23C 16/26* (2006.01)
  (Continued)

(52) U.S. Cl.
  CPC ............ *C23C 16/26* (2013.01); *C01B 32/186* (2017.08); *C23C 16/0245* (2013.01);
  (Continued)

(58) Field of Classification Search
  CPC ..... C23C 16/26; C23C 16/0245; C23C 16/50; C01B 32/186; D06M 10/025; D06M 10/06; D06M 11/74; D06M 2101/06
  (Continued)

(56) References Cited

U.S. PATENT DOCUMENTS

| 2004/0005461 A1* | 1/2004 | Nagle .................. C04B 35/573 428/408 |
| 2014/0322608 A1* | 10/2014 | Claussen ............... H01G 11/36 429/224 |

FOREIGN PATENT DOCUMENTS

WO    WO2013066474    * 5/2013

OTHER PUBLICATIONS

Bhuvana et al., Contiguous Petal-like Carbon Nanosheet Outgrowths from Graphite Fibers by Plasma CVD, Feb. 16, 2010, Applied Materials and Interfaces, vol. 2 No. 3, pp. 644-648. (Year: 2010).*

(Continued)

*Primary Examiner* — Cephia D Toomer
(74) *Attorney, Agent, or Firm* — Reichel Stohry LLP; Natalie J. Dean; Mark C. Reichel

(57) ABSTRACT

Compositions of matter including a cloth base comprising one or more not fully carbon fibers woven together, where at least a portion of the not fully carbon fibers of the cloth base are carbonized and comprise graphene petals thereon. The not fully carbon fibers may be selected from a variety of materials including cellulose fibers such as hemp, linen, and/or cotton, and may also or alternatively include synthetic fibers such as polyester, Kevlar, and/or Rayon. A method for producing such a carbonized conductive fiber-based cloth is also provided, the method including carbonizing a cloth base comprising not fully carbon fibers in a plasma stream of a plasma process and growing graphene petals integrally on the carbonized cloth using the same plasma process.

20 Claims, 5 Drawing Sheets

(51) Int. Cl.
    *C23C 16/50* (2006.01)
    *D06M 11/74* (2006.01)
    *C23C 16/02* (2006.01)
    *D06M 10/02* (2006.01)
    *D06M 10/06* (2006.01)
    *C01B 32/186* (2017.01)
    *D06M 101/06* (2006.01)

(52) U.S. Cl.
    CPC ........... *C23C 16/50* (2013.01); *D06M 10/025* (2013.01); *D06M 10/06* (2013.01); *D06M 11/74* (2013.01); *D06M 2101/06* (2013.01)

(58) Field of Classification Search
    USPC .......................................... 442/181; 428/141
    See application file for complete search history.

(56) References Cited

OTHER PUBLICATIONS

Molina Puerto, J (2016) Graphene-based fabrics and their applications: a review. RSC Advances. 6:68261-68291. doi:10.1039/c6ra12365a. (Year: 2016).*

* cited by examiner

COMPOSITIONS OF MATTER AND METHODS OF PRODUCING A CARBONIZED CLOTH FOR GROWTH OF GRAPHENE NANO-PETALS

PRIORITY CLAIM

This application is related to: (a) and claims the priority benefit of U.S. Provisional Patent Application Ser. No. 62/108,454 to Fisher et al., filed on Jan. 27, 2015; and (b) the U.S. Nonprovisional patent application Ser. No. 14/181,106 to Claussen et al., filed on Feb. 14, 2014, and entitled "Modified Graphitic Electrodes for Electrochemical Energy Storage Enhancement." The contents of each of the aforementioned applications are hereby expressly incorporated by reference in their entireties into this disclosure.

BACKGROUND

Carbon nano-structures and metal nano-structures are finding applications in a number of areas today. These are especially so where conductivity and electrical sensitivity are primary concerns. Carbon nano-petals are opening up use for these graphene based sheets in supercapacitor (also referred to as an ultracapacitor) manufacture and also in high capacity battery applications. One limitation to their use is the cost of the substrate material that is used for the growth of these petals Conventionally, conductive copper and nickel sheets and carbon cloth are used as a substrate to grow graphene, metalized, or otherwise surface-functionalized nano-petals for applications where a conductive sheet with large surface area is necessary. However, copper and nickel are prohibitively expensive to use as substrate materials and carbon cloth is difficult to manufacture inexpensively. Accordingly, these conventional substrate materials are relatively high in cost, which is prohibitive to the commercial application of these substrates. Since the applications where these conductive materials are used are cost sensitive, a low cost material with higher surface area is needed for use in such applications.

BRIEF SUMMARY

In at least one exemplary embodiment of the present disclosure, a method for growing graphene petals is provided, the method comprising the steps of: carbonizing a cloth base in a plasma stream of a plasma process, the cloth base comprising fibers that are not fully carbon; and growing graphene petals integrally on the carbonized cloth base using the same plasma process. In at least one embodiment, the plasma process of the exemplary method may comprise a plasma-enhanced chemical vapor deposition process and the steps of carbonizing a cloth base and growing graphene petals occur simultaneously. Additionally or alternatively, the plasma process of the method may be selected from the group consisting of a microwave plasma-enhanced chemical vapor deposition process, a radio frequency plasma-enhanced chemical vapor deposition process, a low pressure chemical vapor deposition process, and a direct current arc discharge process.

In certain embodiments of the method provided herein, the cloth base comprises one or more woven structures and comprises fibers that are not fully carbon. For example, and without limitation, in at least one embodiment, the cloth base may comprise a woven fabric comprising cellulose fibers including, but not limited to, cotton, hemp, and/or linen fibers. Additionally or alternatively, the cloth base may comprise synthetic fibers including, but not limited to, polyester, Rayon, and/or Kevlar.

Additional methods for growing graphene petals are also provided. In yet another exemplary embodiment, a method for growing graphene petals comprises: using a fiber based cloth as a base material (for example, such as a cellulose-based cloth, woven cotton fabric or linen fabric), the fiber based cloth comprising one or more fibers that are not fully carbon; introducing the fiber based cloth into a plasma process chamber; introducing at least one reactant gas into the plasma process chamber with a predetermined proportion of flow rates and pressure; and enabling plasma with a predetermined power level to carbonize at least a surface of the not fully carbon fibers within the plasma process chamber such that graphene petals grow on the carbonized surface of the fibers. In at least one embodiment, the graphene petals grow integrally with the at least one carbonized surface of the fibers. Furthermore, in yet another embodiment of the methods disclosed herein, the carbonization of the not fully carbon fibers and growth of the graphene petals thereon may occur within the same plasma process chamber. Still further, in certain embodiments, the fiber based cloth may retain some composition of the not fully carbon fibers following carbonization.

Additional embodiments also provide specific plasma processes. In at least one embodiment, the step of enabling plasma with a predetermined power level to carbonize at least a surface of the fibers may further comprise using a process selected from a group consisting of a plasma-enhanced chemical vapor deposition process, a microwave plasma-enhanced chemical vapor deposition process, a radio frequency plasma-enhanced chemical vapor deposition process, a low pressure chemical vapor deposition process, and a direct current arc discharge process.

In certain embodiments of the foregoing methods, the at least one reactant gas may comprise a mixture of at least methane and hydrogen gases. There, in at least one exemplary embodiment, the hydrogen gas may contribute to passivate dangling bonds at edges of the graphene petals and enable the graphene petals to retain an open structure during their formation. Additionally or alternatively, the at least one reactant gas may comprise a mixture of at least methane and argon gases, or any mixture of the aforementioned gases.

Exemplary embodiments of compositions of matter are also provided herein. In at least one embodiment, a composition of matter resulting from performing the previously described methods is provided. Other exemplary embodiments of compositions of matter provided herein comprise a cellulose cloth base comprising one or more fibers woven together, wherein at least a portion of the cellulose cloth base is carbonized, has an electrical conductivity that is greater than an electrical conductivity of a non-carbonized cellulose cloth, and comprises graphene petals thereon. Still further, in at least one embodiment, one or more of the fibers of the cellulose cloth base may comprise a plurality of fibers woven together to form one or more woven structures with at least one of such fibers comprising a synthetic fiber. Alternatively, one or more of the fibers of the cellulose cloth base may comprise a filament woven together to form one or more woven structures.

In certain embodiments, each of the fibers of the cellulose cloth base comprises a surface and the carbonized portion of the cellulose cloth base comprises a first surface area of one or more of the fibers. There, the graphene petals may be vertically oriented on the carbonized portion (or surface(s)) of the cellulose cloth, thereby providing a second electrically conductive surface area that is larger than the first surface area. In yet another exemplary embodiment of the composition of matter provided herein, the graphene petals may be integrally grown on the carbonized portion of the cellulose cloth base.

BRIEF DESCRIPTION OF FIGURES

The disclosed exemplary embodiments and other features and advantages thereof, as well as the manner of attaining them, will become apparent and the present disclosure will be better understood when taken in conjunction with the accompanying figures, wherein.

DETAILED DESCRIPTION

Figure 1:
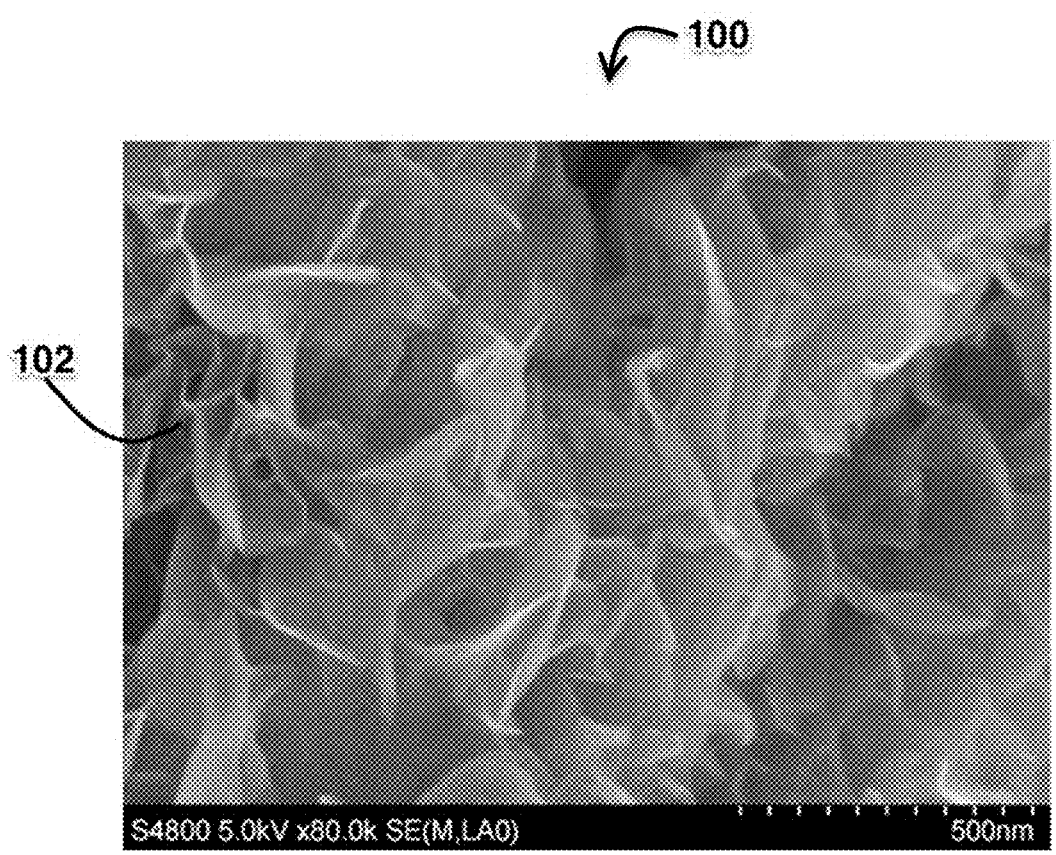
FIG. 1 is a Scanning Electron Microscope (SEM) photograph of graphene nano-petals as grown integrally on a cloth (cellulose fiber converted to carbon) base as per at least one exemplary embodiment of the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended, with any additional alterations and modifications and further applications of the principles of this disclosure being contemplated hereby as would normally occur to one skilled in the art. On the contrary, it is intended to cover alternatives, modifications, and equivalents as may be included within the spirit and scope of this application as defined by the appended claims. While this technology may be illustrated and described in a preferred embodiment, the compositions and methods hereof may comprise many different configurations, forms, materials, and accessories.

For example, compositions of matter, methods, and techniques of the present application will be described in the context of growing graphene nano-petals and/or producing carbonized conductive cellulose-based cloth for growing the same and cellulose-based materials having graphene nano-petals grown thereon. However, it should be noted that the compositions, methods, and techniques of the present application are not limited to solely cellulose-based cloth and/or materials, but instead may include similar low-cost non-cellulose materials and/or other woven fibers as described herein. Indeed, while much of this disclosure describes the compositions of matter and methods of the present disclosure in terms of cellulose fibers and/or a cellulose cloth base, this is done solely for the sake of providing a clear and concise disclosure and it will be appreciated that the alternative non-cellulose materials and fibers described herein may also be used interchangeably.

In the following description, numerous specific details are set forth in order to provide a thorough understanding of the present disclosure. Particular examples may be implemented without some or all of these specific details. In other instances, well known process operations and/or system configurations have not been described in detail so as to not unnecessarily obscure the present disclosure.

The embodiments of the disclosure described herein are not intended to be exhaustive or to limit the invention to precise forms disclosed. Rather, the embodiments selected for description have been chosen to enable one skilled in the art to practice the disclosure. Furthermore, wherever feasible and convenient, like reference numerals are used in the figures and the description to refer to the same or like parts or steps.

Recently, carbon nano-petal structures (also known as graphene nano-petal structures), and other similar nano structures and particles have attracted increasing interest due to their unique properties and broad application possibilities in electronics, sensors, energy storage, solar cells, surface enhanced Raman scattering, etc. Recent work by the inventors has revealed that composites of graphene nano-petals with other nano-materials, such as noble metal nano-particles (NPs) and metal oxide, are effective electrochemical sensing platforms due, at least in part, to the synergistic effects between the graphene nano-petals and the selected nano-materials. Graphene nano-petal covered conductive sheets hence not only provide a large surface area, but also serve as the electrical conduction medium necessary for electron transfer. Furthermore, that these nano-petals can be grown without additional catalyst is another advantage for the use of the nano-petal covered sheets.

Currently, one of the most expensive components in the growth and application of the nano-petals is the substrate material, or feedstock, on which these nano-petals are grown. Conventional substrates include copper sheets, nickel sheets, tin sheets and carbon cloth, which are all expensive to use and, thus, are cost prohibitive to the mass production of the material. In order to reduce the cost of manufacture of the nano-petals and expand their use across a variety of applications, it is necessary to bring down the overall cost of manufacturing the same. One area of interest has been the use of alternative, more cost-effective substrates.

In at least one exemplary embodiment of the present disclosure, a novel, cost-effective, cloth composition is disclosed. In at least one embodiment, the cloth comprises cellulose and/or other organic or synthetic fibers (for example, natural, not fully carbon fibers such as cotton, hemp, linen and/or the like, and/or synthetic fibers such as Rayon, polyester, Kevlar, etc.) as a base material on which carbon/graphene nano-petals can be grown. Perhaps more specifically, at least a portion of the cellulose fibers (or cotton, hemp, linen and/or synthetic fibers or the like) of the cloth become converted to conductive carbonized fibers and, on the surface of these conductive carbonized fibers, carbon (graphene) nano-petals are grown in an integral or vertically-oriented fashion, thus increasing the effective surface area of the cloth. Note that both vertically-oriented and integral nano-petals extend in a generally vertical orientation relative to the substrate surface, but integrally grown petals tend to be more wrinkled as compared to integrally grown petals. The growth of carbon nano-petals on the fibers of the carbonized cloth fibers also increases the material's overall electrical conductivity, as well as the effective surface area of the electrically conductive carbonized cloth base. This, in turn, provides a very low-cost base for the growth of carbon nano-petals as compared to the full carbon cloths conventionally employed.

The exemplary compositions and methods of the present disclosure thus provide for a low-cost base for the generation of a conductive electrode material, such base having an increased surface area and being particularly useful for sensors and supercapacitors and other similar applications. Furthermore, in at least one embodiment, the compositions hereof (and the methods of producing the same) may optionally retain a core of cellulose-like fiber (or any other non-cellulose fiber used) that is not completely carbonized, which can be advantageous as it allows the resulting material to retain certain beneficial mechanical properties of the original fibers.

As described in more detail herein, plasma-enhanced chemical vapor deposition processes may be used to grow carbon nanostructures like carbon nano tubes, carbon nano sheets etc. For example, and without limitation, graphene nano-petals may be created in a vacuum using plasma-enhanced chemical vapor deposition by exposing a cloth of carbon fiber to high-energy plasma that contains hydrogen ions and other ingredients. There are several different types of plasma-enhanced chemical vapor deposition processes that may be used for graphene growth including, without limitation, microwave plasma-enhanced chemical vapor deposition, RF plasma-enhanced chemical vapor deposition, DC plasma-enhanced chemical vapor deposition, and other plasma-enhanced chemical vapor depositions, all of which are generically referred to herein as a "PECVD."

The PECVD process may grow vertically-oriented and/or integral graphene on various substrate materials. Other methods used to grow vertically-oriented and/or integral graphene include RF plasma and DC arc discharge. For the avoidance of doubt, any of these or similar processes may be employed in connection with preparing the novel cloth compositions disclosed herein to achieve the desired carbon nanostructure growth.

In order to prevent the vertically grown graphene films and petals from forming closed structures during the PECVD process, gas mixtures of hydrogen (H2) or H2 and argon (Ar) may be applied. Specifically, the ionized hydrogen atoms in particular facilitate termination of the dangling bonds at the edges of the graphene to prevent formation of closed structures, thereby maintaining the exposed edges of the graphene petals as receptors to further chemical functionalization, reactions with target gasses to be sensed, or ionic species to intercalate into the graphene. Accordingly, the addition of H2 and/or Ar to the PECVD process beneficially allows for the graphene petals to retain their open structure.

By using a cloth of cellulose fibers (or, for example, other fibers such as cotton, hemp, linen or synthetics) and converting the cellulose fibers to carbon in a plasma chamber during the graphene growth process using PECVD, a carbonized base material without the expense of manufactured carbon fibers is produced and available as the base material for growth of graphene petals. Additionally, the use of manufactured carbon cloth for graphene growth has issues due to its fully crystalline structure with multiple graphite crystals stacked along their basal planes. Specifically, with the carbon cloth, the normal to the basal planes of the formed graphite crystals point perpendicular to the surface of the fibers, thus making the integral growth of graphene on these fibers difficult. However, the carbonized cotton (or not fully carbon) fibers of the present disclosure facilitate the integral growth of graphene petals from the carbonized surface as they do not have such a strong graphite crystal structure. Accordingly, the inventive composition of the present disclosure provides a more amenable surface for integral growth of graphene petals on the carbonized surface and the petals tend to be more firmly attached to the substrate. Furthermore, depending on how long or intensely the cloth is processed in the plasma chamber (or via like processes), the core of the cloth material may not be completely carbonized thus leaving behind some cellulose-like (or other) material in the core. While this may result in the possible reduction in conductivity of the base material, it also provides a carbonized cloth that exhibits much better mechanical properties than conventional full-carbon substrates.

The plasma growth process itself typically uses reactant gas mixtures comprising methane (CH4) gas and hydrogen (H2) gas typically in a 4:1 to 6:1 ratio at about 10 to about 50 Torr pressure and enabling the plasma with a typical plasma power between about 500 to about 5000 Watts to carbonize the cellulose and generate integral graphene growth thereon.

The current disclosure hence provides for a low cost substrate for growth of the carbon/graphene petals using normal cloth such as cotton woven fabric or linen. This cloth is mainly cellulose (hydrocarbon) based and, when introduced into the plasma stream, converts into a carbonized conductive film on which the graphene (carbon) nano-petals are grown. In at least one exemplary embodiment, the graphene growth is accomplished through the use of microwave PECVD ("MPECVD") or radio frequency PECVD. It is also possible to use other types of plasma processes such as low-pressure chemical vapor deposition (LPCVD) for the process of carbonization of the cotton cloth and for growing the graphene nano-petals on the base carbonized cloth. These plasma processes have been found to be notably effective in this application, at least in part, because they are less aggressive than conventional methods of graphene growth and allow for much lower substrate temperatures that do not completely burn up the cellulose (or other not fully carbon) fibers.

By enabling conversion of the cotton cloth substrate material to a conductive carbon based cloth from the cellulose, the connectivity of the carbon nano-petals grown is integrated to the carbon cloth base and provides for the use of the resultant product in applications of sensors, batteries, super-capacitors and similar applications. Since the cost structure of the inventive base material—cotton (cellulose) based cloth—is much lower, the cost of the final product is substantially reduced, thereby enabling its use in applications that are cost sensitive. Furthermore, unlike conventional base materials, using cotton (cellulose based) cloth as the base material allows for large-scale manufacture of the completed carbon nano-petal product at low cost.

FIG. 1 is a SEM photograph 100 that shows graphene nano-petals 102 grown on an inventive cloth 101 (cellulose fiber converted to carbon) (not shown) as a conductive base in accordance with the present disclosure. Here, the cloth 101 was used as the base conductive material on which the nano-petals 102 were grown integrally on its carbonized surface. Since a full carbon cloth made with carbon fibers is itself an expensive commodity that costs over $9.00 per yard in volume even for the least expensive option, the cost of the finished product grown on a fully-carbon cloth is extremely high for applications that are cost sensitive and/or with little margin such as, for example, capacitors and battery electrodes. However, use of the cloth 101 (cellulose fiber converted to carbon) as a substrate significantly reduces the cost of the finished product as the cloth 101 itself is much less expensive.

Figure 2:
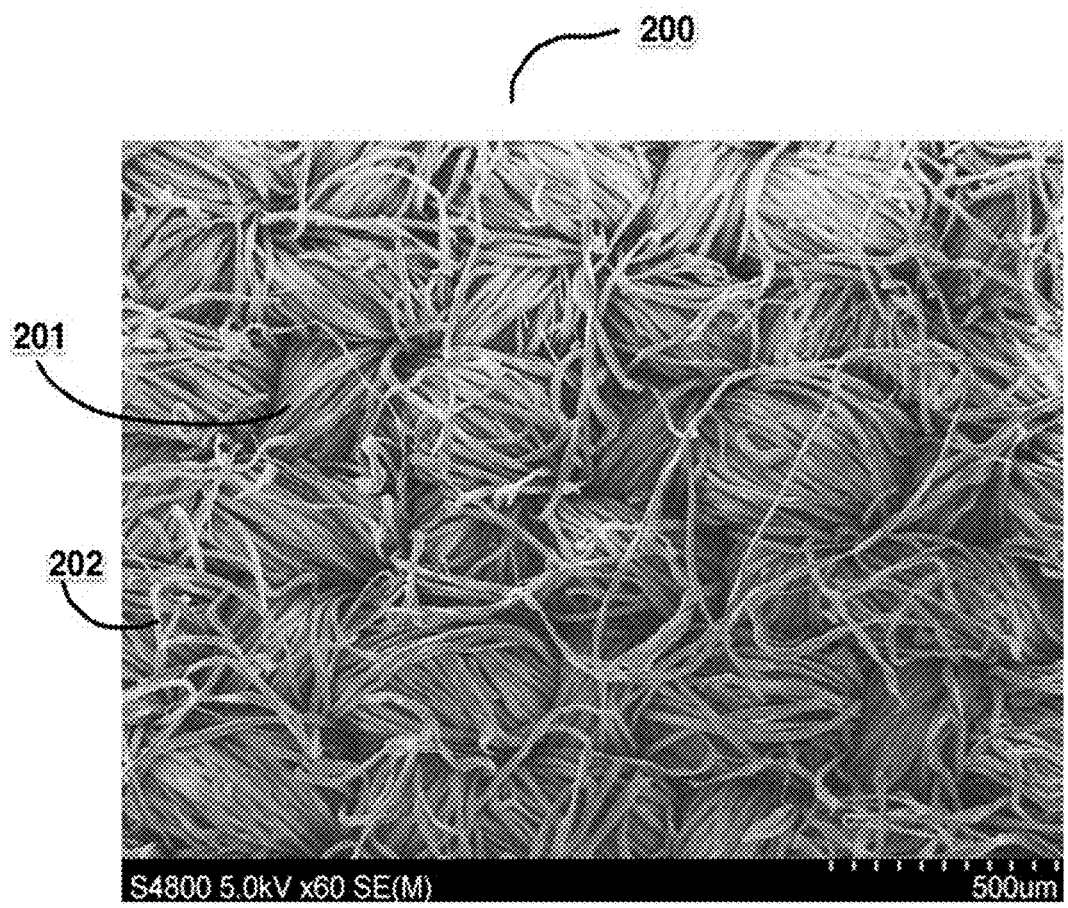
FIG. 2 is a SEM photograph of at least one exemplary embodiment of a cellulose based cloth to be used as the carbonized base for graphene nano-petal growth as per at least one exemplary embodiment of a method of the present disclosure.

FIG. 2 is a SEM photograph 200 of at least one embodiment of an inventive cotton cloth material 201 in accordance with the present disclosure. In this at least one embodiment, the cotton cloth material 201 forms the base for the graphene nano-petal growth process as per an embodiment of the current application. Notably, when the cotton cloth material 201 is processed through the PECVD process, at least a portion of the cotton cloth fibers 202 convert to carbonized conductive cloth fibers and enable the resulting carbonized cloth to form the base for growth of the graphene nano-petals 102 in the same process chamber as the one used with the carbon cloth feedstock as the base material during the processing of the graphene nano-petals 102.

Figure 3:
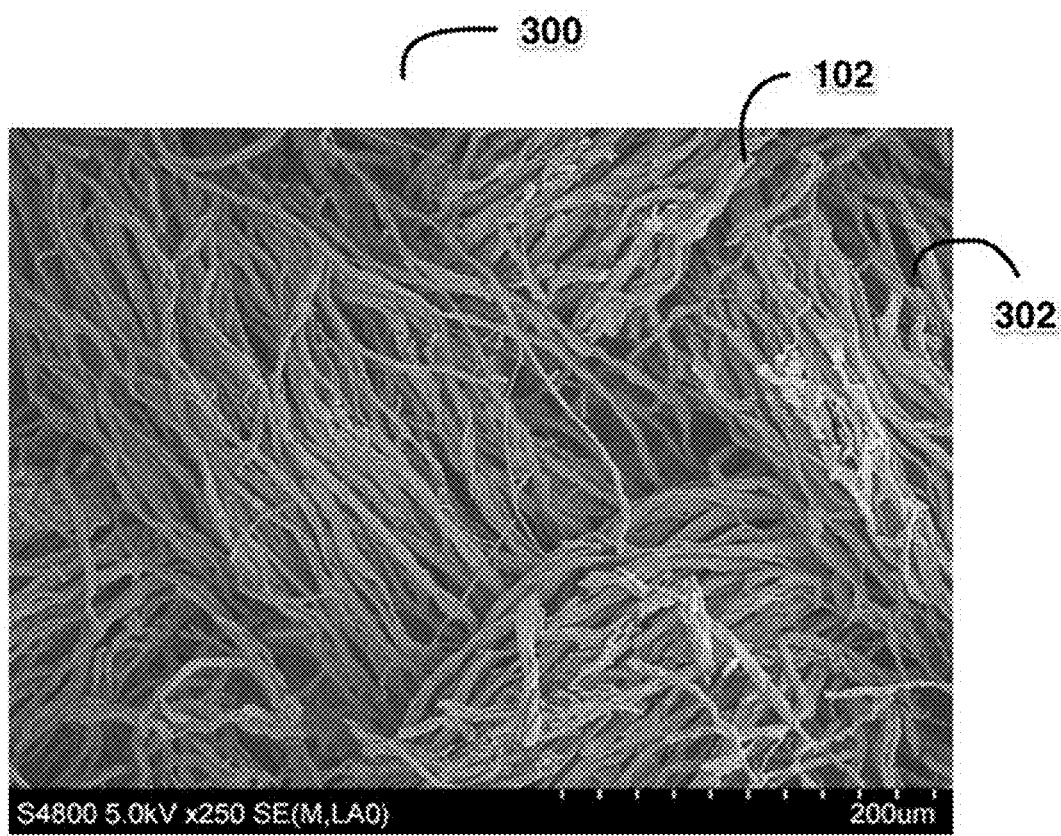
FIG. 3 shows a SEM photograph of the nano-petals grown by a microwave plasma chemical vapor deposition (CVD) process on the cellulose cloth of FIG. 2 that has since been converted to a conductive cloth by the plasma treatment in the plasma stream as per at least one exemplary embodiment of a method of the present disclosure.

FIG. 3 is a photograph 300 of the graphene nano-petals 102 formed on the surface of the cellulose (cotton) cloth base 201 (not shown) that has been converted to a carbonized conductive cloth base 302, and used as a base instead of conventional carbon cloth 101, for the graphene nano-petal 102 growth. The carbonization of the cotton cloth 201 happens within the reaction chamber of the PECVD reactor during the processing and growth of the graphene nano-petals 102. Accordingly, in at least one embodiment of the present disclosure, the process of conversion of the cellulose cloth 201 to a conductive carbonized cloth 302 and the growth of the graphene nano-petals 102 in an integral fashion on the carbonized filaments 203 of the cellulose cloth 201 do not introduce any additional process steps or complexity to the process of graphene nano-petal 102 growth using the PECVD process.

Furthermore, use of the embodiments of compositions provided herein to grow nano-petals 102 can also reduce the number of steps required as compared to use of conventional full-carbon materials. For example, in many cases, the conventional carbon cloth precursor contains a surface coating (called 'sizing'). Where that is the case, the sizing or surface coating must be removed prior to processing the material and nano-petal 102 growth. Cellulose cloth bases do not require this sizing step and, as such, require less steps to process, thereby further reducing costs associated with its manufacture.

Figures 4A, 4B:
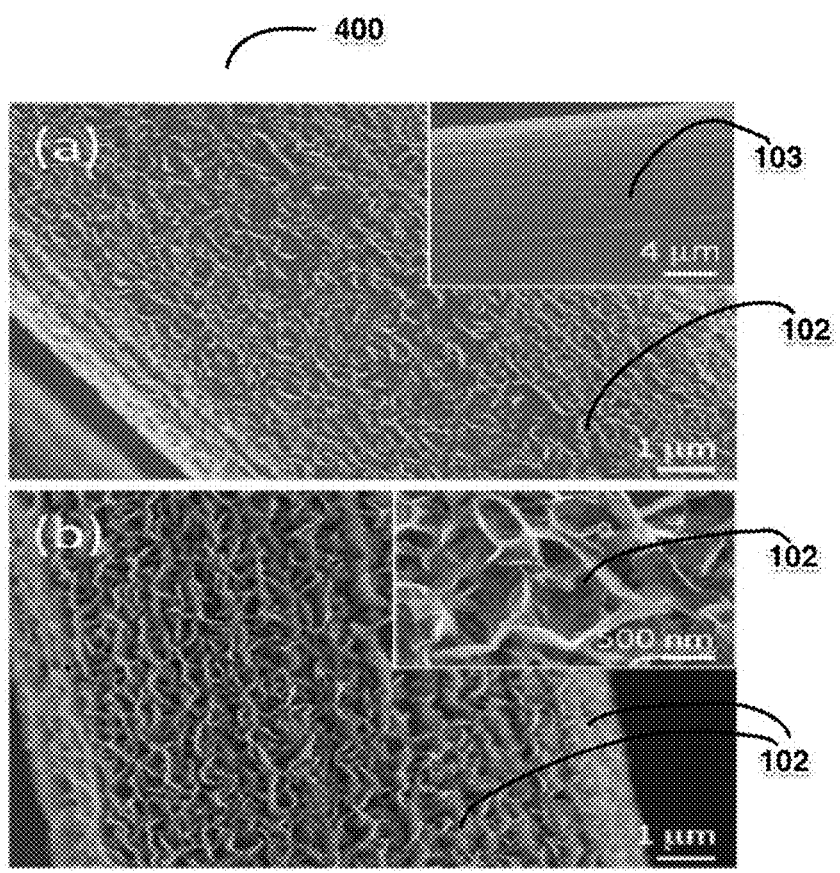
FIG. 4a is a SEM photograph of the graphene nano-petals growth start on a conventional full carbon fiber base with the inset photograph showing the texture of full carbon fiber prior to nano-petal growth.
FIG. 4b is a SEM photograph of the graphene nano-petals grown on at least one exemplary embodiment of the cellulose fiber base of the present disclosure, with the inset photograph showing the graphene nano-petals in a higher magnification.

FIG. 4a is a SEM picture 400 of the start of growth of graphene nano-petals 102 on a conventional carbon fiber 103 in an integral fashion. Since the base material on the surface of the carbon fiber 103 and the base material on the surface of the carbonized cellulose fibers 203 are both carbon, the growth of graphene nano-petals 102 follows a similar pattern of growth on both the carbonized filaments 103 and the carbonized cotton filaments 203. The inset in FIG. 4a shows the smooth structure of the carbon fiber 103 prior to graphene nano-petal 102 growth.

FIG. 4b is a SEM picture of the fiber (carbon or carbonized cotton) with graphene nano-petals 102 grown thereon. The inset of FIG. 4b shows an enlarged view of the graphene nano-petals 102 as grown.

Figure 5:
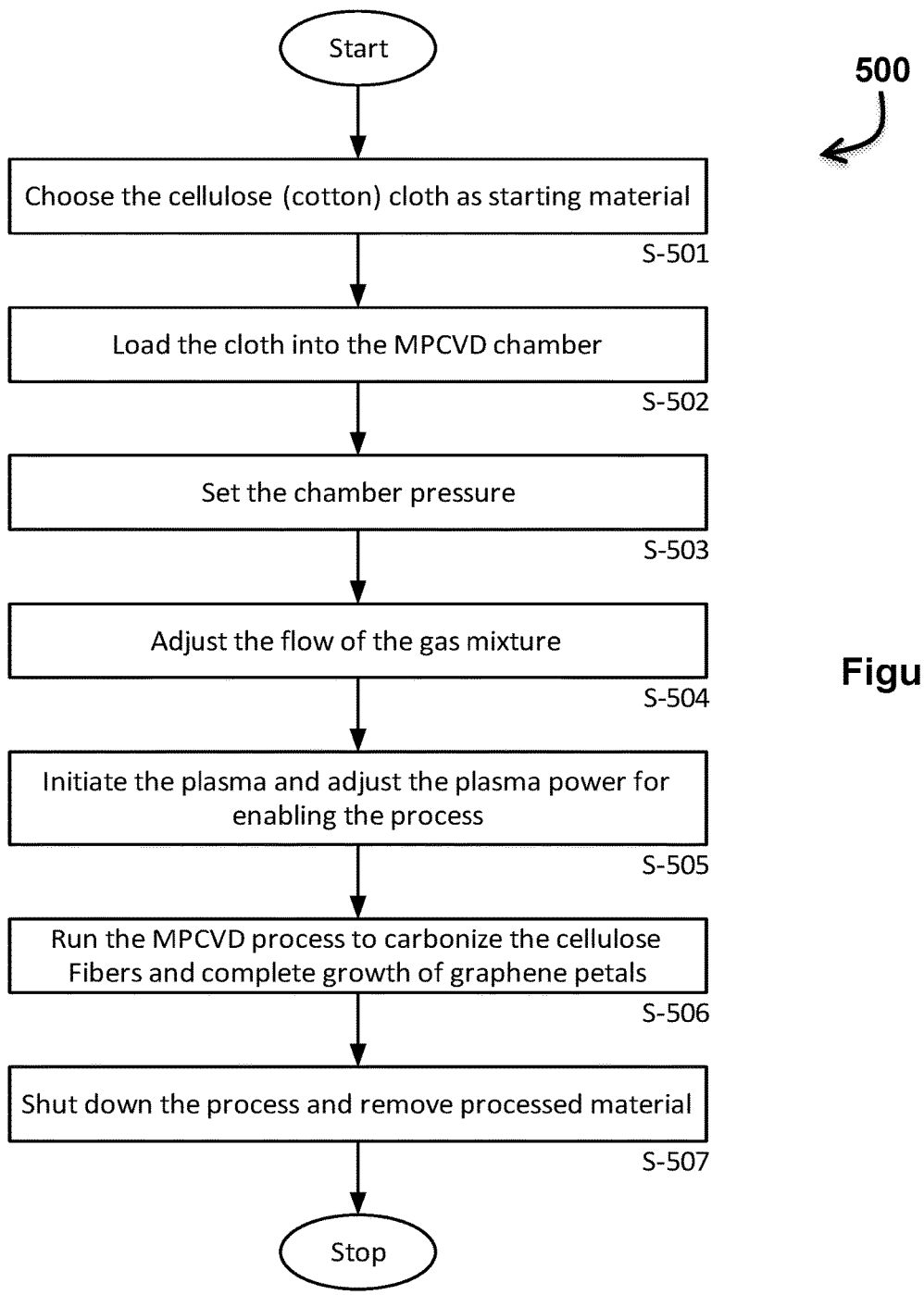
FIG. 5 shows a flow chart of at least one exemplary embodiment of a method of the present application for in-situ carbonization of the fibers of the exemplary cellulose cloth base of FIG. 2 and growing graphene nano-petals thereon using a chemical vapor deposition process chamber.

FIG. 5 depicts a flow chart of at least one exemplary method 500 of the present disclosure for the in-situ carbonization of cellulose cloth fibers for use as the base material for the growth of the graphene nano-petals. Furthermore, certain embodiments of the method 500 further comprise the growth of the graphene nano-petals there on.

As shown in FIG. 5, at step S501, the cellulose fiber (cotton) cloth 201 is chosen as the starting material, to be carbonized and used as the base material 302 for growth of graphene nano-petals 102 there on. As previously described, cellulose fiber cloth 201 is a much more cost effective material than what is conventionally available for nanomaterial production and, as such, provides significant advantages as compared to conventional carbon cloth bases.

At step S502, the cotton cloth 201 is loaded into the PECVD process chamber (which, in at least one exemplary embodiment, comprises a MPCVD process chamber). As a part of establishing the process conditions, at step S503 the chamber pressure is set and, at step S504, the gas flow of process gas mixture into the chamber is established as is known in the art.

The plasma CVD process is initiated within the plasma chamber at step S505. Once the desired PECVD process is started, the power levels within the plasma are adjusted to enable in-situ carbonization of the cellulose fibers 202 of the cloth 201. In this manner, at step S506 the cloth 201 is converted to a conductive cloth base 302 in the plasma and graphene nano-petals 102 are grown in an integral fashion on the carbonized fibers 203 of the conductive cloth base 302.

As previously described, the intensity and/or duration of the PECVD process may be adjusted to achieve a desired level of carbonization in the cellulose cloth. For example, a user may adjust the PECVD process to allow the cellulose cloth to completely carbonize if high overall conductivity of the substrate is desired. Alternatively, a user may regulate or stop the PECVD process before the cellulose cloth is carbonized all of the way through to ensure some degree of cellulose-like material remains present in the core. It will be appreciated the length of time the method 500 remains at processing step S506 or advances to step S507, and/or the specifics of this processing step S506 may be established pursuant to user preference and/or the desired application of the end product.

Once sufficient growth of the graphene nano-petals 102 on the base cloth 302 is achieved, the PECVD process is shut down (or stopped) and the processed material is removed from the PECVD process chamber at step S507. The resulting material comprises a carbonized conductive cloth 302 (carbonized cellulose) with graphene nano-petals 102 integrally grown thereon.

The use of the cotton/cellulose cloth, which costs less than $1 per yard in bulk, converted to a carbonized cotton for use as a base for graphene nano-petal 102 allows for a substantial reduction in cost of the finished product and enables the use of grown graphene nano-petal products in low cost applications. This is extremely significant as, to date, the application of grown graphene nano-petal products has been limited due to the high material costs associated therewith.

While various embodiments of the compositions and methods of the present disclosure have been described in considerable detail herein, the embodiments are merely offered as non-limiting examples. Many variations and modifications of the embodiments described herein will be apparent to one of ordinary skill in the art in light of the disclosure. For example, and without limitation, although the present disclosure is described herein with reference to cellulose cloth base embodiments, one skilled in the art will readily appreciate that other similar low-cost cloth materials (e.g., hemp and linen, as well as synthetics such as polyester, Rayon, Kevlar and the like) and other types of woven structures (e.g., plain, herringbone, basket, twill, satin, jacquard, gauze, pile, and the like) and processes for carbonization may be substituted for those set forth herein without departing from the spirit and scope of the present disclosure. It will therefore be understood by those skilled in the art that various changes and modifications may be made, and equivalents may be substituted for elements thereof, without departing from the scope of the present disclosure.

The present disclosure is not intended to be exhaustive or limiting with respect to the content thereof. The scope of the disclosure is to be defined by the appended claims, and by their equivalents.

Furthermore, in describing representative embodiments, the present disclosure may have presented a method and/or a process as a particular sequence of steps. However, to the extent that the method or process does not rely on the particular order of steps set forth therein, the method or process should not be limited to the particular sequence of steps described, as other sequences of steps may be possible. Therefore, unless expressly stated otherwise, the particular order of the steps disclosed herein should not be construed as limitations of the present disclosure. In addition, any claims directed to a method and/or process should not be limited to the performance of their steps in the order written (unless expressly specified otherwise), and one skilled in the art can readily appreciate that the sequences may be varied and still remain within the scope of the present disclosure.

The invention claimed is:

1. A method for growing graphene petals comprising:
    providing a cloth base comprising fibers that are not fully carbon;
    carbonizing the cloth base in a plasma stream of a plasma process; and
    growing graphene petals integrally on the carbonized cloth base using the same plasma process.

2. The method of claim 1, wherein the plasma process comprises a plasma-enhanced chemical vapor deposition process and the steps of carbonizing a cloth base and growing graphene petals occur simultaneously.

3. The method of claim 1, wherein the plasma process is selected from the group consisting of a microwave plasma-enhanced chemical vapor deposition process, a radio frequency plasma-enhanced chemical vapor deposition process, a low pressure chemical vapor deposition process and a direct current arc discharge process.

4. The method of claim 1, wherein the cloth base comprises one or more woven structures.

5. The method of claim 4, wherein the cloth base comprises cellulose fibers.

6. The method of claim 4, wherein the cloth base comprises synthetic fibers.

7. A method for growing graphene petals comprising:
    using a fiber based cloth as a base material, the fiber based cloth comprising one or more fibers that are not fully carbon;
    introducing the fiber based cloth into a plasma process chamber;
    introducing at least one reactant gas into the plasma process chamber with a predetermined proportion of flow rates and pressure; and
    enabling plasma with a power level at or between 500 to 5000 Watts to carbonize at least a surface of the not fully carbon fibers within the plasma process chamber such that graphene petals grow on the carbonized surface of the fibers.

8. The method of claim 7, wherein the at least one reactant gas comprises a mixture of at least methane and hydrogen gases and the hydrogen gas contributes to passivate dangling bonds at edges of the graphene petals and enables the graphene petals to retain an open structure.

9. The method of claim 7, wherein the at least one reactant gas comprises a mixture of at least methane and argon gases.

10. The method of claim 7, wherein carbonization of the not fully carbon fibers and growth of graphene petals thereon occur within the same plasma process chamber.

11. The method of claim 7, wherein the graphene petals grow integrally with the at least one carbonized surface of the fibers.

12. The method of claim 7, wherein at least some of the fibers comprise synthetic fibers selected from a group consisting of polyester, Rayon, and Kevlar.

13. The method of claim 7, wherein the step of enabling plasma with a predetermined power level to carbonize at least a surface of the fibers further comprises using a process selected from a group consisting of a plasma-enhanced chemical vapor deposition process, a microwave plasma-enhanced chemical vapor deposition process, a radio frequency plasma-enhanced chemical vapor deposition process, a low pressure chemical vapor deposition process, and a direct current arc discharge process.

14. The method of claim 7, wherein the fiber based cloth retains some composition of the not fully carbon fibers following carbonization.

15. The method of claim 7, wherein at least some of the not fully carbon fibers of the fiber based cloth comprise cellulose fibers selected from a group consisting of cotton, hemp, and linen.

16. A composition of matter comprising:
    a cellulose cloth base comprising one or more fibers woven together;
    wherein a first a portion of the cellulose cloth base is carbonized, has an electrical conductivity that is greater than an electrical conductivity of a non-carbonized cellulose cloth, and comprises graphene petals grown on one or more carbonized surfaces thereof; and
    wherein a second portion of the cellulose cloth base is not fully carbonized.

17. The composition of matter of claim 16, wherein:
    each of the fibers of the first portion of the cellulose cloth base comprises at least one of the one or more carbonized surfaces;
    the first portion of the cellulose cloth base comprises a first surface area; and
    the graphene petals are vertically oriented on each of the one or more carbonized surfaces of the first portion of the cellulose cloth base, thereby providing a second electrically conductive surface area that is larger than the first surface area.

18. The composition of matter of claim 16, wherein the one or more fibers of the cellulose cloth base comprises a plurality of fibers woven together to form one or more woven structures with at least one of such fibers of the second portion comprising a synthetic fiber.

19. The composition of matter of claim 16, wherein the one or more fibers of the cellulose cloth base comprises a filament woven together to form one or more woven structures.

20. The composition of matter of claim 16, wherein the graphene petals are integrally grown on the one or more carbonized surfaces of the first portion of the cellulose cloth base.

\* \* \* \* \*